United States Patent [19]

Kawatani et al.

[11] Patent Number: 5,439,161
[45] Date of Patent: Aug. 8, 1995

[54] THERMOCOMPRESSION BONDING APPARATUS, THERMOCOMPRESSION BONDING METHOD AND PROCESS OF MANUFACTURING LIQUID CRYSTAL DISPLAY DEVICE

[75] Inventors: Norio Kawatani, Kanagawa; Iwao Ichikawa, Tokyo; Kazuaki Suzuki; Yukio Yamada, both of Tochigi, all of Japan

[73] Assignee: Sony Corporation, Japan

[21] Appl. No.: 301,389

[22] Filed: Sep. 7, 1994

[30] Foreign Application Priority Data

Sep. 8, 1993 [JP] Japan .................. 5-247438

[51] Int. Cl.⁶ .......................... H01L 21/603
[52] U.S. Cl. .................. 228/180.21; 228/212; 228/44.7
[58] Field of Search ............... 228/180.1, 180.21, 212, 228/6.2, 44.7; 437/206, 220

[56] References Cited

U.S. PATENT DOCUMENTS 3,628,717  12/1971  Lynch et al. ............ 228/44.7
4,573,627  3/1986  Miller et al. ........... 228/44.7
5,377,897  1/1995  Zimmer .................. 228/212

*Primary Examiner*—Samuel M. Heinrich
*Attorney, Agent, or Firm*—Ronald P. Kananen

[57] ABSTRACT

A thermocompression bonding apparatus wherein object parts can be connected with a high degree of accuracy by thermocompression bonding and the entire apparatus is not deformed readily by a high pressure and a member of a large size can be connected at a fine pitch with a high degree of accuracy. The thermocompression bonding apparatus is constructed so as to bond a first member to a second member by thermocompression bonding and comprises a base member, a holding device for holding the second member thereon, a heat generation element for applying heat to the first member, and a pressurization member for pressing the heat generation element against the first member and the second member. The holding device, the heat generation element and the pressurization member are disposed mechanically separately from the base member. Also a thermocompression bonding method and a process of manufacturing a liquid crystal display device which are performed using the thermocompression bonding apparatus are disclosed.

9 Claims, 5 Drawing Sheets

THERMOCOMPRESSION BONDING APPARATUS, THERMOCOMPRESSION BONDING METHOD AND PROCESS OF MANUFACTURING LIQUID CRYSTAL DISPLAY DEVICE

BACKGROUND OF THE INVENTION

This invention relates to a thermocompression bonding apparatus and a thermocompression bonding method for bonding a plurality of members by thermocompression bonding as well as a process of manufacturing a liquid crystal display device.

Various thermocompression bonding apparatus are conventionally known and have such a general construction as shown in FIG. 6.

Referring to FIG. 6, a column or support post 114 is secured to a base 102, and also a guide rail 103b is secured to the base 102.

A pressurization cylinder 109 is secured to an upper portion of the column 114, and a thermocompression head 107 is directly mounted on a rod 109a of the pressurization cylinder 109.

A liquid crystal display (LCD) panel 105 is carried on a platform 104. The platform 104 has a pair of guides 103a received by the guide rail 103b. Thus, the platform 104 can move in the directions indicated by a double-sided arrow mark Y along the guide rail 103b.

A terminal portion 106 of the TAB type has, for example, such a construction as described below. The terminal portion 106 of the TAB type denotes a terminal portion formed by Tape Automated Bonding and is constructed such that copper foil patterns of circuits are adhered to a resin film of polyimide, which serves as a base, and IC chips are adhered to the copper foil patterns of circuits.

Meanwhile, the liquid crystal display panel 105 has fine circuit patterns formed, for example, from an anisotropic conductive film thereon.

In order to bond the terminal portion 106 of the TAB type to the liquid crystal display panel 105 by thermocompression bonding, the pressurization cylinder 109 is rendered operative to move the rod 109a downwardly. Consequently, the thermocompression head 107 is pressed against the terminal portion 106 of the TAB type so that, for example, output side terminals of electrodes of an IC of the terminal portion 106 of the TAB type and the fine circuit patterns of the liquid crystal display panel 105 formed from an anisotropic conductive film are connected and bonded to each other by thermocompression bonding.

The conventional thermocompression bonding apparatus of the type described above, however, has the following problems.

In particular, the platform 104 for receiving a liquid crystal display panel 105 thereon and the column 114 for the pressurization cylinder 109 are both secured directly to the single base 102.

Accordingly, when the pressurization cylinder 109 operates for thermocompression bonding, the base 102 is deformed by a reaction to the compression force. The influence of the deformation of the base 102 is had on the entire apparatus, and particularly the accuracy in position of the platform 104 for the liquid crystal display panel 105 undergoes a bad influence of the deformation, resulting in degradation in connection accuracy by such thermocompression bonding as described above.

Since the thermocompression head 107 and the rod 109a are directly connected to the column 114, the accuracy in relative position between the liquid crystal display panel 105 and the thermocompression head 107 relies upon the rigidity of the entire apparatus including the base 102.

A possible countermeasure for eliminating an influence of the deformation of the base 102 upon the entire apparatus is to raise the rigidity of the entire thermocompression bonding apparatus to prevent or minimize the deformation of the base. This, however, cannot avoid an increase in scale or in weight of the thermocompression bonding apparatus and cannot meet a demand for miniaturization.

Further, since the base suffers from deformation, it is difficult to further reduce the connection pitch in thermocompression bonding or to raise the connection accuracy.

Further, in order to sufficiently assure the parallelism between the liquid crystal display panel 105 and the thermocompression head 107, it is necessary to increase the part accuracy and the assembly accuracy of each element and prevent thermal deformation of each element.

In order to manufacture a liquid crystal display device using the liquid crystal display panel 105 of a large size and the terminal portion 106 of the TAB type, particularly the pressurization cylinder 109 must generate a high pressure, and it is difficult for the conventional thermocompression bonding apparatus of FIG. 6 to perform fine connection by thermocompression bonding.

SUMMARY OF THE INVENTION

It is an object of the present invention to provide a thermocompression bonding apparatus, a thermocompression bonding method and a process of manufacturing a liquid crystal display device wherein object parts can be connected with a high degree of accuracy by thermocompression bonding.

It is another object of the present invention to provide a thermocompression bonding apparatus, a thermocompression bonding method and a process of manufacturing a liquid crystal display device wherein the entire apparatus is not deformed readily by a high pressure and a member of a large size can be connected at a fine pitch with a high degree of accuracy.

In accordance with an aspect of the present invention, the objects described above are achieved by a thermocompression bonding apparatus for bonding a first member to a second member by thermocompression bonding, which comprises a base member, holding means for holding the second member thereon, heat generation means for applying heat to the first member, and pressurization means for pressing the heat generation means against the first member and the second member, the holding means, the heat generation means and the pressurization means being disposed mechanically separately from the base member.

Preferably, the pressurization means includes expansion/contraction means, and a clamping member operable in response to expansion of the expansion/contraction means for clamping the holding means, the heat generation means, the first member and the second member.

Preferably, the expansion/contraction means of the pressurization means is expandable in a first direction, and the holding means is movable in a second direction different from the first direction. Preferably, the heat generation means is mounted for movement in the first direction by way of slide means. Preferably, the expansion/contraction means and the clamping means of the pressurization means are mounted for movement in the first direction with respect to the base member with resilient means interposed therebetween. Preferably, the thermocompression bonding apparatus further comprises support means for supporting the clamping means of the pressurization means for pivotal motion relative to the base member in a direction parallel to the second direction.

The first member may be a terminal portion of the TAB type, and the second member may be a liquid crystal display panel.

In accordance with the present invention, the objects described above are achieved by a thermocompression bonding method for bonding a first member to a second member by thermocompression bonding, which comprises the steps of positioning the first member and the second member on holding means, clamping and pressurizing the first member, the second member, heat generation means and the holding means between pressurization means which is mounted mechanically separately on and for movement relative to a base member, and bonding the first member and the second member to each other by thermocompression bonding by heat generated by the heat generation means.

With the thermocompression bonding apparatus and the thermocompression bonding method, the second member is held by the holding means, and heat is applied to the first member by the heat generation means. Then, the heat generation means is pressed against the first member and the second member by the pressurization means. Upon such pressurization, the holding means, the heat generation means and the pressurization means operate mechanically separately from the base member.

Since the holding means, the heat generation means and the pressurization means operate mechanically separately from the base member upon pressurization, the connection accuracy of the first and second members to be bonded by thermocompression bonding can be enhanced. Further, since the entire apparatus is not deformed readily even if a high pressure is generated, the first member and the second member can be connected to each other with a fine pitch or in a fine accuracy even where they have large sizes.

In accordance with the present invention, the objects described above are achieved also by a process of manufacturing a liquid crystal display device, which comprises the steps of positioning a terminal portion of the TAB type on a liquid crystal display panel by holding means, clamping and pressurizing the liquid crystal display panel, the terminal portion of the TAB type, heat generation means and the holding means between pressurization means which is mounted mechanically separately on and for movement relative to a base member, and bonding the liquid display panel and the terminal portion of the TAB type by thermocompression bonding by heat generated by the heat generation means.

With the process of manufacturing a liquid crystal display device, the liquid crystal display panel is held by the holding means, and heat is applied to the terminal portion of the TAB type by the heat generation means. Then, the heat generation means is pressed against the terminal portion of the TAB type and the liquid crystal display panel by the pressurization means. Upon such pressurization, the holding means, the heat generation means and the pressurization means operate mechanically separately from the base member. Consequently, the connection accuracy of the terminal portion of the TAB type and the liquid crystal display panel to be bonded by thermocompression bonding can be enhanced. Further, since the entire manufacturing apparatus is not deformed readily even if a high pressure is generated, the terminal portion of the TAB TYPE and the liquid crystal display panel can be connected to each other with a fine pitch or in a fine accuracy even where they have large sizes.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1:
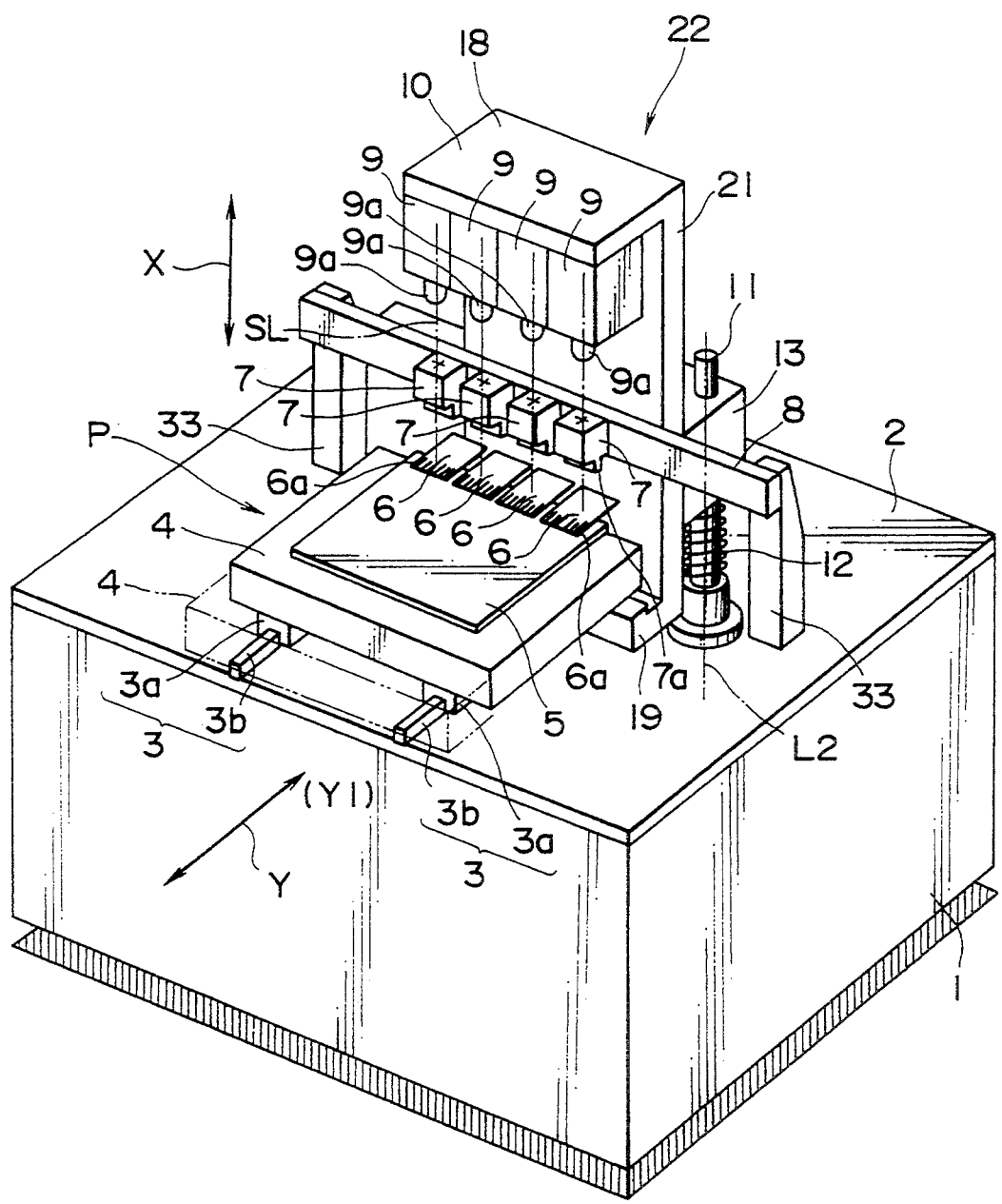
FIG. 1 is a perspective view of an entire thermocompression bonding apparatus showing a preferred embodiment of the present invention.

Referring first to FIG. 1, there is shown a thermocompression bonding apparatus to which the present invention is applied. The thermocompression bonding apparatus is formed as an apparatus for bonding predetermined locations of a liquid crystal display panel 5 and predetermined locations of terminal portions 6 of the TAB type to each other by thermocompression bonding.

The terminal portions 6 of the TAB type have, for example, such a construction as described below. In particular, a terminal portion 6 of the TAB type denotes a terminal portion formed by Tape Automated Bonding such that IC chips are adhered to copper foil patterns of circuits adhered to a base formed from a resin film of polyimide.

Meanwhile, fine circuit patterns are formed from, for example, an anisotropic conductive film (ACF) on the liquid crystal display panel 5.

The thermocompression bonding apparatus includes a platform 4 serving as holding means, a plurality of thermocompression bonding heads 7 serving as heat generation means, pressurization means 22 and a frame 1.

The frame 1 has a base 2 on an upper face thereof, and the frame 1 and the base 2 cooperatively construct a base member.

Figure 2:
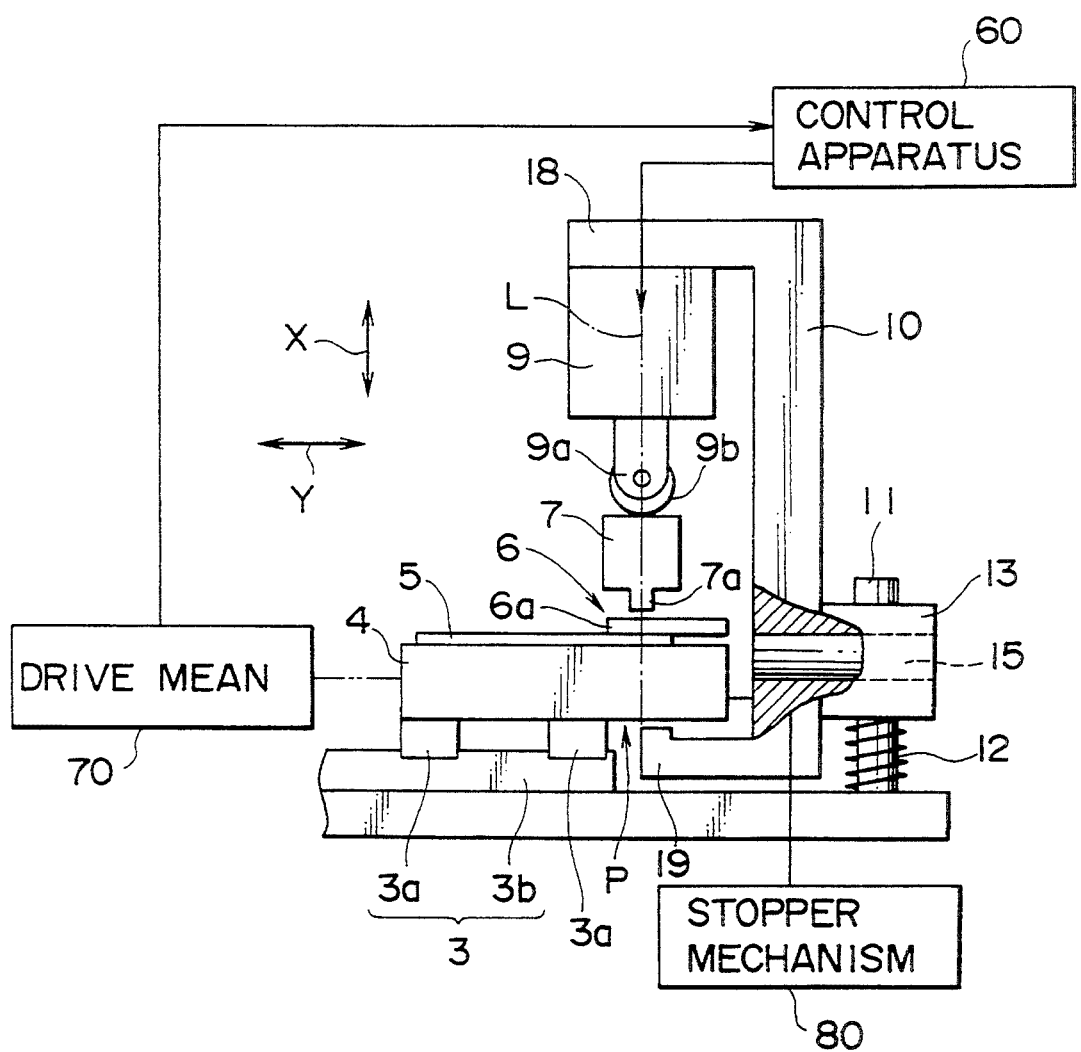
FIG. 2 is a side elevational, diagrammatic view of the thermocompression bonding apparatus of FIG. 1.

Referring to FIGS. 1 and 2, the platform 4 also called liquid crystal display receiver has four slide members 3a which are secured to four corner locations of the bottom face of the platform 4.

A pair of guide rails 3b are secured in parallel to each other to the base 2 of the frame 1. As seen in FIG. 2, the guide rails 3b, the four slide members 3a and drive means 70 constitute moving means 3. When the drive means 70 is energized, the platform 4 is moved in a direction indicated by a double-sided arrow mark Y along the two guide rails 3b cooperating with the slide members 3a.

The platform 4 is in the form of a plate having a rectangular or square shape as viewed from above.

The platform 4 in the form of a plate is constructed to carry a liquid crystal display panel 5 in position thereon.

The platform 4 can be positioned at a predetermined position P in regard to movement in a direction of the arrow mark Y by a stopper mechanism 80 shown in FIG. 2.

As an example, four terminal portions 6 of the TAB type are carried at predetermined locations of the liquid crystal display panel 5 as shown in FIG. 1. Each of the terminal portions 6 of the TAB type corresponds to a first member, and the liquid crystal display panel 5 corresponds to a second member.

Referring to FIGS. 1 and 2, in the arrangement shown, the thermocompression bonding heads 7 are provided by four heads so that they correspond to the four terminal portions 6 of the TAB type. Each of the thermocompression bonding heads 7 serves as heat generation means and presses down a corresponding terminal portion 6 of the TAB type while providing heat to the terminal portion 6 of the TAB type and the liquid crystal display panel 5. Each of the thermocompression bonding heads 7 has a protruding end 7a.

Figure 3:
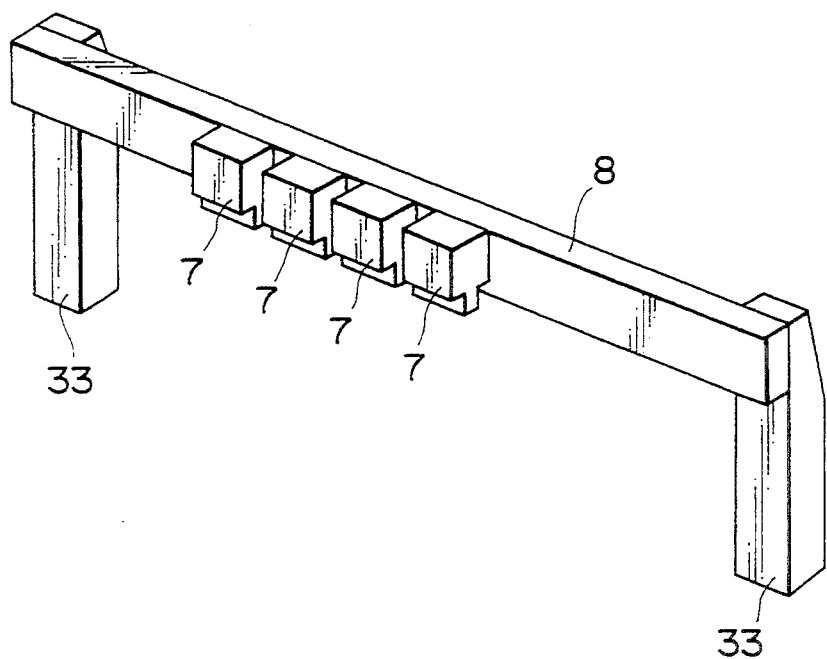
FIG. 3 is a perspective view showing a plurality of thermocompression bonding heads and support means for supporting the thermocompression bonding heads in the thermocompression bonding apparatus of FIG. 1.

A support bar 8 for the thermocompression bonding heads 7 is secured to the base 2 by way of a pair of members 33 as seen in FIGS. 1 and 3. The support bar 8 extends in parallel to the base 2.

Figure 4:
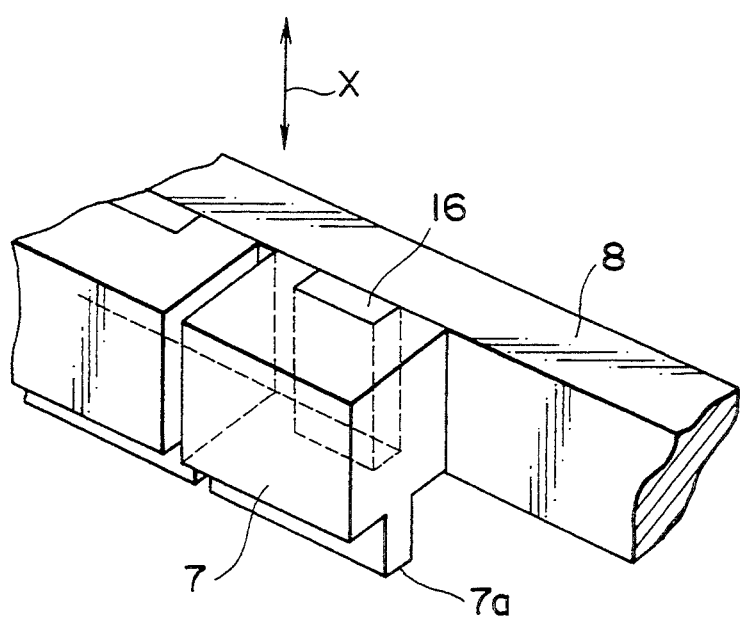
FIG. 4 is an enlarged perspective view showing part of a thermocompression bonding head and a support bar in the thermocompression bonding apparatus of FIG. 1.

As shown in FIG. 4, the thermocompression bonding heads 7 are mounted for individual movement in directions indicated by a double-sided arrow mark X relative to the support bar 8 each by way of a slide bearing 16 serving as slide means.

As shown in FIGS. 1 and 2, each of the thermocompression bonding heads 7 is disposed above a corresponding one of the terminal portions 6 of the TAB type.

Figure 5:
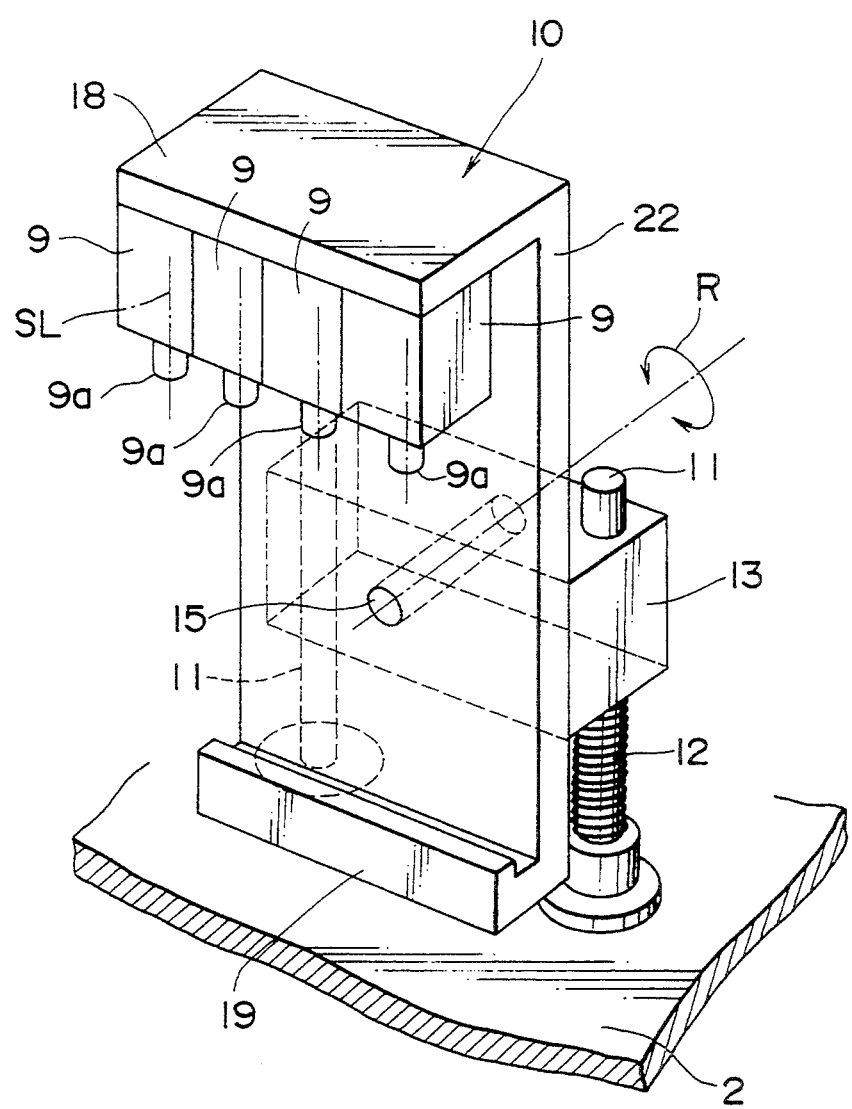
FIG. 5 is an enlarged perspective view showing the structure of pressurization means in the thermocompression bonding apparatus of FIG. 1.
Figure 6:
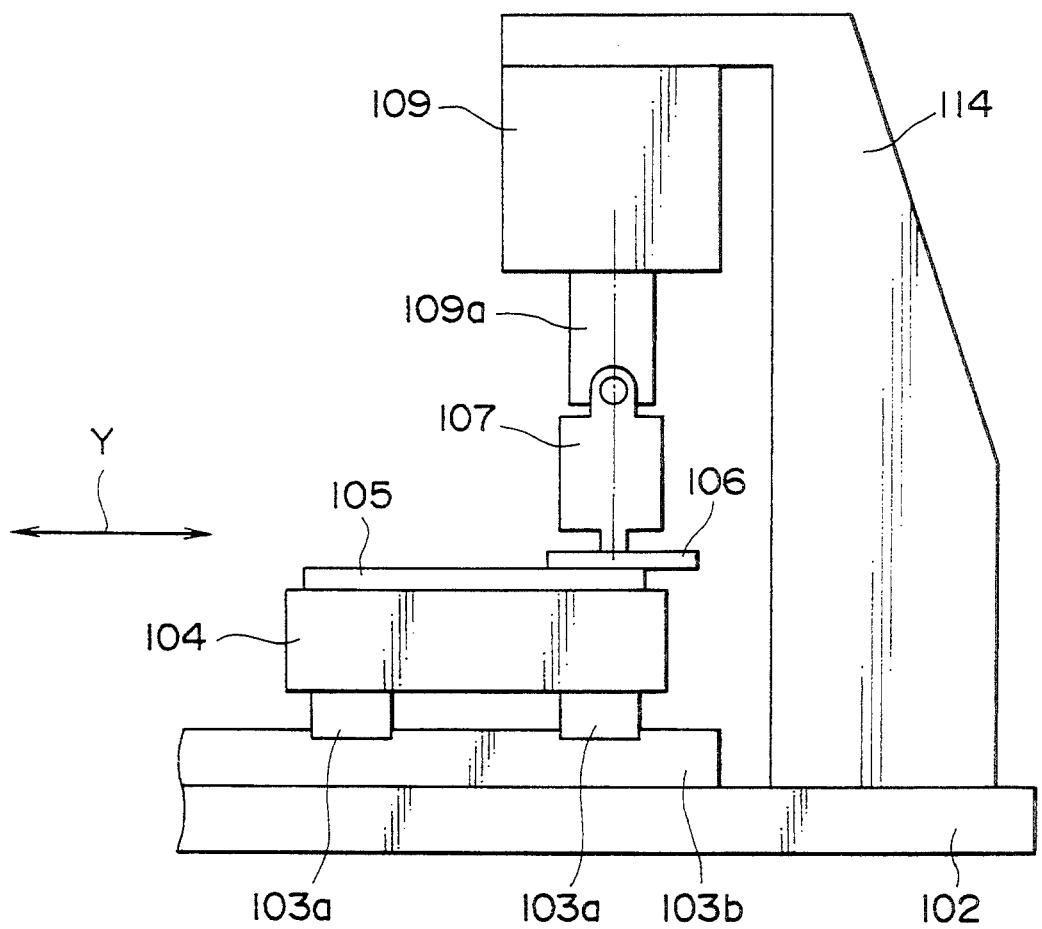
FIG. 6 is a side elevational view showing a conventional thermocompression bonding apparatus.

Referring now to FIGS. 1 and 5, the pressurization means 22 includes four pressurization cylinders 9 serving as extension/contraction means, clamping means 10, a pair of slide shafts 11, a slide bearing 13, a pair of springs 12 and a pin 15.

The slide shafts 11 are secured vertically at bottom ends thereof to the base 2. The slide shafts 11 are inserted in holes of the slide bearing 13, which is resiliently supported for movement in the directions of the arrow mark X with the pair of springs 12 fitted on the slide shafts 11.

The clamping means 10 is supported for pivotal motion in directions indicated by a double-sided arrow mark R relative to the slide bearing 13 by way of the pin 15 serving as support means. In other words, the clamping means 10 can be rocked or pivoted in the directions of the arrow mark R relative to the slide bearing 13 by way of the pin 15.

The clamping means 10 is constituted from a top portion 18, a supporting portion 19 and an intermediate portion 21 as seen from FIGS. 1 and 2. The intermediate portion 21 is secured at a central portion thereof to the pin 15.

The clamping means 10 is also called pressurization cylinder holding plate and has a generally substantially C-shaped profile as seen in FIG. 2.

The four pressurization cylinders 9 are secured in a juxtaposed relationship to a lower face of the top portion 18 of the clamping means 10 and directed downwardly. The rod 9a of each of the pressurization cylinders 9 can be extended downwardly. A roller 9b is mounted on the rod 9a of each of the pressurization cylinders 9 as shown in FIG. 2.

The reason why the roller 9b is mounted in this manner is that it is intended to allow the rod 9a and a thermocompression bonding head 7 to contact with each other by point contact by way of the roller roller 9b to reduce the slip friction between the pressurization cylinder 9 and the thermocompression bonding head 7 which is otherwise increased by incoincidence between axial lines of the rod 9a and the thermocompression bonding head 7.

Referring to FIG. 1, an axial line interconnecting the center of each of the rods 9a and the center of a corresponding one of the thermocompression bonding heads 7 is denoted by SL. The terminal portion 6 of the TAB type is located on the axial line SL. The axial lines SL and the axial lines of the slide shafts 11 extend in parallel to the direction indicated by the arrow mark X which is a first direction.

It is to be noted that the drive means 70 and the pressurization cylinders 9 are controlled by a control apparatus 60 as seen from FIG. 2.

Subsequently, a process of performing thermocompression bonding between a liquid crystal display panel 5 and the terminal portions 6 of the TAB type to manufacture a liquid crystal display device using the thermocompression bonding apparatus described above will be described.

First, as shown in FIGS. 1 and 2, a liquid crystal display panel 5 is fixed in position on the platform 4. The terminal portions 6 of the TAB type are temporarily fixed to the liquid crystal display panel 5.

In FIG. 1, the platform 4 indicated by an alternate long and short dash line represents the initial position of the platform 4. The platform 4 moves from the initial position to the predetermined position P along a direction indicated by the arrow mark Y (Y1).

Consequently, the liquid crystal display panel 5 and the terminal portions 6 of the TAB type come to a position between the thermocompression bonding heads 7 and the supporting portion 19 of the clamping means 10 as seen from FIGS. 1 and 2. Consequently, the pressurization cylinders 9, the thermocompression bonding heads 7 and connection portions 6a of the terminal portions 6 of the TAB type are aligned with each other in the vertical direction (parallel to the direction of the arrow mark X).

In this instance, the platform 4 is positioned by the stopper mechanism 80 shown in FIG. 2.

In the condition wherein the terminal portions 6 of the TAB type and the liquid crystal display panel 5 are positioned between the thermocompression bonding heads 7 and the supporting portion 19 of the pressurization means 22 in this manner, the connection portions 6a of the terminal portions 6 of the TAB type are in alignment with the axial lines SL between the pressurization cylinders 9 and the thermocompression bonding heads 7.

Subsequently, the pressurization cylinders 9 are rendered operative so that the rods 9a thereof are moved down by a predetermined amount. As a result of the downward movement of the rods 9a, the rods 9a are contacted with the corresponding thermocompression bonding heads 7 to push down the thermocompression bonding heads 7. Consequently, the thermocompression bonding heads 7 are slidably moved downwardly by way of the slide bearing 16 of FIG. 4.

Accordingly, the thermocompression bonding heads 7 pushed by the rod 9a are moved down until they are contacted with the connection portions 6a of the terminal portions 6 of the TAB type. The forces exerted by the pressurization cylinders 9 are transmitted up to the terminal portions 6 of the TAB type, and when they generate pressures which are higher than the weights of the pressurization cylinders 9 including the clamping means 10, the clamping means 10 including the pressurization cylinders 9 is pushed upwardly.

Consequently, since the clamping means 10 has a substantially C-shaped configuration, the thermocompression bonding heads 7, the terminal portions 6 of the TAB type, the liquid crystal display panel 5 and the platform 4 are clamped by the clamping means 10.

Since the clamping force then is all absorbed by the clamping means 10 and the clamping means 10 including the pressurization cylinders 9 and the base 2 are not mechanically fixed directly to each other, the force is not transmitted to the base 2.

Further, the springs 12 generate, as a reaction, a force to balance with the weight of the pressurization cylinders 9, the clamping means 10, the pin 15 and the slide bearing 13.

Consequently, the initial force of the pressurization cylinders 9 for clamping the terminal portions 6 of the TAB type and the liquid crystal display panel 5 is smaller than the reactive forces of the springs 12. In order to reduce the initial force by the reactive forces of the springs 12, the pressurization cylinders 9 should be selected so that they have the performance of generating an original pressure necessary to pressurize the terminal portions 6 of the TAB type.

Since the thrusts of the pressurization cylinders 9 are, for example, approximately 20 to 30 kg/cm$^2$ with contact areas between the thermocompression bonding heads 7 and the terminal portions 6 of the TAB type, the clamping means 10 is deformed by the thrust forces.

When such deformation of the clamping means 10 occurs, this will bend the rods 9a, which serve as pressure shafts of the pressurization cylinders 9, so that alignment of the axial lines SL between the thermocompression bonding heads 7 and the rods 9a will be lost.

However, in the thermocompression bonding apparatus of the present embodiment, since the thermocompression bonding heads 7 are mounted on the support bar 8 for the thermocompression bonding heads 7 by way of the slide bearing 16 as shown in FIG. 4, the thermocompression bonding heads 7 operate vertically independently of each other with reference to the base 2, the axial lines SL are not varied at all.

Further, the thermocompression bonding heads 7 and the platform 4 for a liquid crystal display panel are positioned with reference to the base 2 when the thermocompression bonding apparatus is assembled.

The displacement in parallelism between the pressurization cylinders 9 and the thermocompression bonding heads 7 which is produced by the displacement of the axial lines SL caused by the thrusts of the pressurization cylinders 9 is absorbed in the following manner. In particular, since the clamping means or pressurization cylinder holding plate 10 can be pivoted with respect to the slide bearing 13 around the pin 15, the clamping means 10 operates so that it automatically follows, due to the thrust thereof, the thermocompression bonding heads 7 and the platform 4 to absorb the displacement in parallelism.

In this manner, in the embodiment shown, the pressurization cylinders 9, the thermocompression bonding heads 7, the liquid crystal display panel 5 and the connection portions 6a of the terminal portion 6 of the TAB type are disposed linearly to each other.

The pressurization cylinders 9 and the clamping means 10 are not fixed to the base 2. In particular, the pressurization means 22 also called pressurization clamp mechanism has a so-called floating mechanism so that the parallelism thereof may be established with reference to the platform 4 serving as the holding means.

Also the thermocompression bonding heads 7 are disposed mechanically separately from the pressurization cylinders 9 and the clamping means 10.

Also the platform 4 is not directly secured to and can be disposed mechanically separately from the base 2 similarly.

The clamping means 10 is in a floating condition with respect to the base 2 by way of the springs 12. Accordingly, when the relative position of the clamping means 10 to the liquid crystal display panel 5 is varied by deformation caused by the force produced by the clamping means 10 itself, the clamping means 10 can move in a direction to cancel the amount of deformation.

Accordingly, there is an advantage in that, even if deformation of the clamping means 10 including the pressurization cylinders by the thrusts of the pressurization cylinders 9 occurs, the deformation does not have a direct influence upon the relative accuracy between the thermocompression bonding heads 7 and the platform 4 for a liquid crystal display panel.

In this manner, in the embodiment of the present invention, since the thermocompression bonding heads 7 are pressed against the terminal portions 6 of the TAB type in such a manner as described above, for example, output side terminals of the electrodes of the IC at the terminal portions 6 of the TAB type and fine circuit patterns formed from an anisotropic conductive film of the liquid crystal display panel 5 can be connected and bonded to each other by thermocompression bonding.

The embodiment of the present is a thermocompression bonding apparatus particularly for connection of fine patterns formed from an anisotropic conductive film (ACF), which is characterized in that, in order to prevent patterns to be connected from being displaced out of alignment, it is so shaped as to hold or clamp a liquid crystal display panel so that the pressures of the pressurization cylinders may not cause stress deformation of the mounting portions of the liquid crystal display panel (LCD panel).

Further, a liquid crystal display device can be manufactured by bonding the terminal portions 6 of the TAB type and the liquid crystal display panel 5 by thermocompression bonding.

Since the deformation of the thermocompression bonding apparatus can be minimized, the accuracy in connection between a first member and a second member can be enhanced.

The present invention can be applied sufficiently also to thermocompression bonding of a first member such as a terminal portion of the TAB type to a second member such as a large size LCD panel. In particular, even where, for example, a large size LCD panel is placed on the holding means, since the holding means and the pressurization means are mechanically separate from each other, even if the large size LCD panel is very heavy, the entire thermocompression bonding apparatus is not deformed.

Further, connection of connection portions of a fine pitch can be performed. In particular, there is no displacement in relative position between the heat generation means and the first member.

Particularly since an apparatus of a high rigidity as in the prior art need not be produced, the production cost of the apparatus can be reduced.

Further, since the holding means, the heat generation means and the pressurization means are mechanically separate and independent of each other, the maintenance of the apparatus is easy and modification to an equipment for production can be performed readily.

It is to be noted that, while, in the embodiment described above, the terminal portions 6 of the TAB type are each adopted as the first member and the liquid crystal display panel is adopted as the second member, the first and second members are not limited to them, and the thermocompression bonding apparatus of the present invention can be applied also to thermocompression bonding between some other members.

Having now fully described the invention, it will be apparent to one of ordinary skill in the art that many changes and modifications can be made thereto without departing from the spirit and scope of the invention as set forth herein.

What is claimed is:

1. A thermocompression bonding apparatus for bonding a first member to a second member by thermocompression bonding, comprising:
    a base member;
    holding means for holding the second member thereon;
    heat generation means for applying heat to the first member; and
    pressurization means for pressing said heat generation means against the first member and the second member;
    said holding means, said heat generation means and said pressurization means being disposed mechanically separately from said base member.

2. A thermocompression bonding apparatus according to claim 1, wherein said pressurization means includes expansion/contraction means, and a clamping member operable in response to expansion of said expansion/contraction means for clamping said holding means, said heat generation means, the first member and the second member.

3. A thermocompression bonding apparatus according to claim 2, wherein said expansion/contraction means of said pressurization means is expandable in a first direction, and said holding means is movable in a second direction different from the first direction.

4. A thermocompression bonding apparatus according to claim 3, wherein said heat generation means is mounted for movement in the first direction by way of slide means.

5. A thermocompression bonding apparatus according to claim 3, wherein said expansion/contraction means and said clamping means of said pressurization means are mounted for movement in the first direction with respect to said base member with resilient means interposed therebetween.

6. A thermocompression bonding apparatus according to claim 3, further comprising support means for supporting said clamping means of said pressurization means for pivotal motion relative to said base member in a direction parallel to the second direction.

7. A thermocompression bonding apparatus according to claim 1, wherein the first member is a terminal portion of the TAB type, and the second member is a liquid crystal display panel.

8. A thermocompression bonding method for bonding a first member to a second member by thermocompression bonding, comprising the steps of:
    positioning the first member and the second member on holding means;
    clamping and pressurizing the first member, the second member, heat generation means and said holding means between pressurization means which is mounted mechanically separately on and for movement relative to a base member; and
    bonding the first member and the second member to each other by thermocompression bonding by heat generated by said heat generation means.

9. A process of manufacturing a liquid crystal display device, comprising the steps of:
    positioning a terminal portion of the TAB type on a liquid crystal display panel by holding means;
    clamping and pressurizing the liquid crystal display panel, the terminal portion of the TAB type, heat generation means and said holding means between pressurization means which is mounted mechanically separately on and for movement relative to a base member; and
    bonding the liquid display panel and the terminal portion of the TAB type by thermocompression bonding by heat generated by said heat generation means.

* * * * *